(12) United States Patent
Yang et al.

(10) Patent No.: US 12,228,602 B2
(45) Date of Patent: Feb. 18, 2025

(54) EVALUATING PERFORMANCE OF X-RAY TUBE

(71) Applicant: Siemens Healthcare GmbH, Erlangen (DE)

(72) Inventors: Xin Yuan Yang, Wuxi (CN); Yun Wen Pan, Wuxi (CN); Xi Peng Nie, Wuxi (CN)

(73) Assignee: Siemens Healthineers AG, Erlangen (DE)

( * ) Notice: Subject to any disclaimer, the term of this patent is extended or adjusted under 35 U.S.C. 154(b) by 175 days.

(21) Appl. No.: 17/941,245

(22) Filed: Sep. 9, 2022

(65) Prior Publication Data

US 2023/0079022 A1 Mar. 16, 2023

(30) Foreign Application Priority Data

Sep. 10, 2021 (CN) .......................... 202111062770.5

(51) Int. Cl.
*G01R 19/00* (2006.01)
*G01R 31/00* (2006.01)
*G01R 31/24* (2020.01)
*G01R 31/25* (2006.01)

(52) U.S. Cl.
CPC ....... *G01R 31/257* (2013.01); *G01R 19/0084* (2013.01)

(58) Field of Classification Search
CPC .............. G01R 19/0084; G01R 31/003; G01R 31/1281; G01R 31/257; G06F 18/241
See application file for complete search history.

(56) References Cited

U.S. PATENT DOCUMENTS

| 10,701,791 | B2 * | 6/2020 | Hess ....................... G06F 17/18 |
| 2002/0150514 | A1 | 10/2002 | Haskew |
| 2015/0006093 | A1 | 1/2015 | Hess |
| 2015/0332488 | A1 | 11/2015 | Beck et al. |
| 2020/0008287 | A1 | 1/2020 | Heuft et al. |
| 2020/0029916 | A1 | 1/2020 | Fieselmann et al. |

FOREIGN PATENT DOCUMENTS

| CN | 1514747 A | 7/2004 |
| CN | 106981409 A | 7/2017 |
| CN | 206899446 U | 1/2018 |

(Continued)

OTHER PUBLICATIONS

Yan Bi et al.: "The Prediction Algorithm of The Optimal X-Ray Tube in Variable Energy Imaging"; Apr. 14, 2004. (w/English Abstract).

*Primary Examiner* — Mark R Gaworecki
(74) *Attorney, Agent, or Firm* — Banner & Witcoff Ltd.

(57) ABSTRACT

Evaluating the performance of an X-ray tube by: recording arcing events that occurred during the use of the X-ray tube; classifying the arcing events by severity; generating, on the basis of the classified arcing events, a first growth pattern for occurrences of arcing events; and determining a level of bubbles in the X-ray tube by finding, on the basis of the first growth pattern, a matching second growth pattern associated with a known level of bubbles in the X-ray tube. An X-ray tube may be checked and replaced in a timely manner, without the need for an on-site inspection, by remotely predicting trends or patterns for growth of levels of bubbles in the X-ray tube.

15 Claims, 4 Drawing Sheets

(56) References Cited

FOREIGN PATENT DOCUMENTS

| | | | |
|---|---|---|---|
| CN | 108896106 | A | 11/2018 |
| CN | 109688685 | A | 4/2019 |
| CN | 111918470 | A | 11/2020 |
| CN | 113361956 | A | 9/2021 |
| CN | 216978936 | U | 7/2022 |
| DE | 102012204138 | A1 | 9/2013 |

* cited by examiner

EVALUATING PERFORMANCE OF X-RAY TUBE

TECHNICAL FIELD

The present disclosure relates to X-ray generation technology, and in particular, to a method, an apparatus, an electronic device, a computer-readable storage medium, and a computer program product for evaluating the performance of an X-ray tube.

BACKGROUND

X-ray sources for generating X-rays include an X-ray tube, which is a vacuum tube that converts electrical input into X-rays. The availability of this controllable source of X-rays created the field of radiography, the imaging of partly opaque objects with penetrating radiation. In contrast to other sources of ionizing radiation, X-rays are only produced as long as the X-ray tube is energized. X-ray tubes are widely used in computed tomography (CT) scanners, X-ray diffractometers, X-ray medical imaging devices, and for industrial inspection.

As with a vacuum tube used in an X-ray tube, there is a cathode, which emits electrons into the vacuum and an anode to collect the electrons, thus establishing a flow of electrical current, known as the beam, through the X-ray tube. A high-voltage power source known as the tube voltage, typically 30 kV to 200 kV, is connected across the cathode and anode to accelerate the electrons.

An insulating oil used for cooling during the use of an X-ray tube generates bubbles, which will accumulate as the length of use time increases, reducing the insulativity of the insulating oil. Bubbles will reach the X-ray tube with the insulating oil under the action of the cooling apparatus, and thus when the X-ray tube operates at high voltages, arcing occurs, damaging the X-ray tube.

SUMMARY

According to one aspect of the present disclosure, a method for evaluating the performance of an X-ray tube is provided, which allows evaluation and prediction of a level of bubbles in the X-ray tube in a non-contact and timely manner, so as to obtain information on whether the X-ray tube needs to be maintained or replaced in a timely manner. The method for evaluating the performance of an X-ray tube comprises: recording arcing events that occurred during the use of the X-ray tube; classifying the arcing events by severity; generating, on the basis of the classified arcing events, a first growth pattern for occurrences of arcing events; and determining a level of bubbles in the X-ray tube by finding, on the basis of the first growth pattern, a matching second growth pattern associated with a known level of bubbles in the X-ray tube.

According to another aspect of the present disclosure, an apparatus for evaluating the performance of an X-ray tube is provided, comprising: a sensing part, configured to record arcing events that occurred during the use of the X-ray tube; a processing part, configured to classify the arcing events by severity and generate, on the basis of the classified arcing events, a first growth pattern for occurrences of arcing events; and a computing part, configured to determine a level of bubbles in the X-ray tube by finding, on the basis of the first growth pattern, a matching second growth pattern associated with a known level of bubbles in the X-ray tube.

According to another aspect of the present disclosure, an electronic device is provided, comprising: at least one processor; and a memory communicatively connected to the at least one processor; the memory stores a computer program that, when executed by the at least one processor, implements the method according to the above-described aspects.

According to another aspect of the present disclosure, a non-transitory computer-readable storage medium storing a computer program is provided, wherein the computer program, when executed by a processor, implements the method according to the above-described aspects.

According to another aspect of the present disclosure, a computer program product is provided, comprising a computer program, wherein the computer program, when executed by a processor, implements the method according to the above-described aspects.

According to one or more aspects of the present disclosure, by recording arcing events that occurred during use of an X-ray tube and classifying the arcing events by severity, a plurality of curves may be generated according to the arcing events as a growth pattern for occurrences of arcing events in the X-ray tube, and the growth pattern may be compared with or matched to a plurality of a priori or known growth patterns of the X-ray tube to predict levels of bubbles in the X-ray tube, thereby judging the performance of the X-ray tube or whether it needs to be maintained, replaced, etc. in a timely manner, which improves the experience of use of an X-ray tube product and ensures its reliability.

It should be understood that what has been described in this section is not intended to identify key or important features of aspects of the disclosure, nor is it intended to limit the scope of the present disclosure. Other features of the present disclosure will become readily comprehensible from the following description.

BRIEF DESCRIPTION OF THE DRAWINGS

The drawings illustratively show aspects, constituting a part of the description, and, together with the textual interpretation given in the description, serve to explain exemplary implementations of the aspects. The shown aspects are provided for illustrative purposes only, rather than limiting the scope of the claims. In all the drawings, the same reference signs denote similar but not necessarily identical elements.

Embodiments of the present disclosure will be described in detail below with reference to the drawings so that those of ordinary skill in the art become clearer about the above-described and other features and advantages of the present disclosure, and among the drawings.

Figure 1:
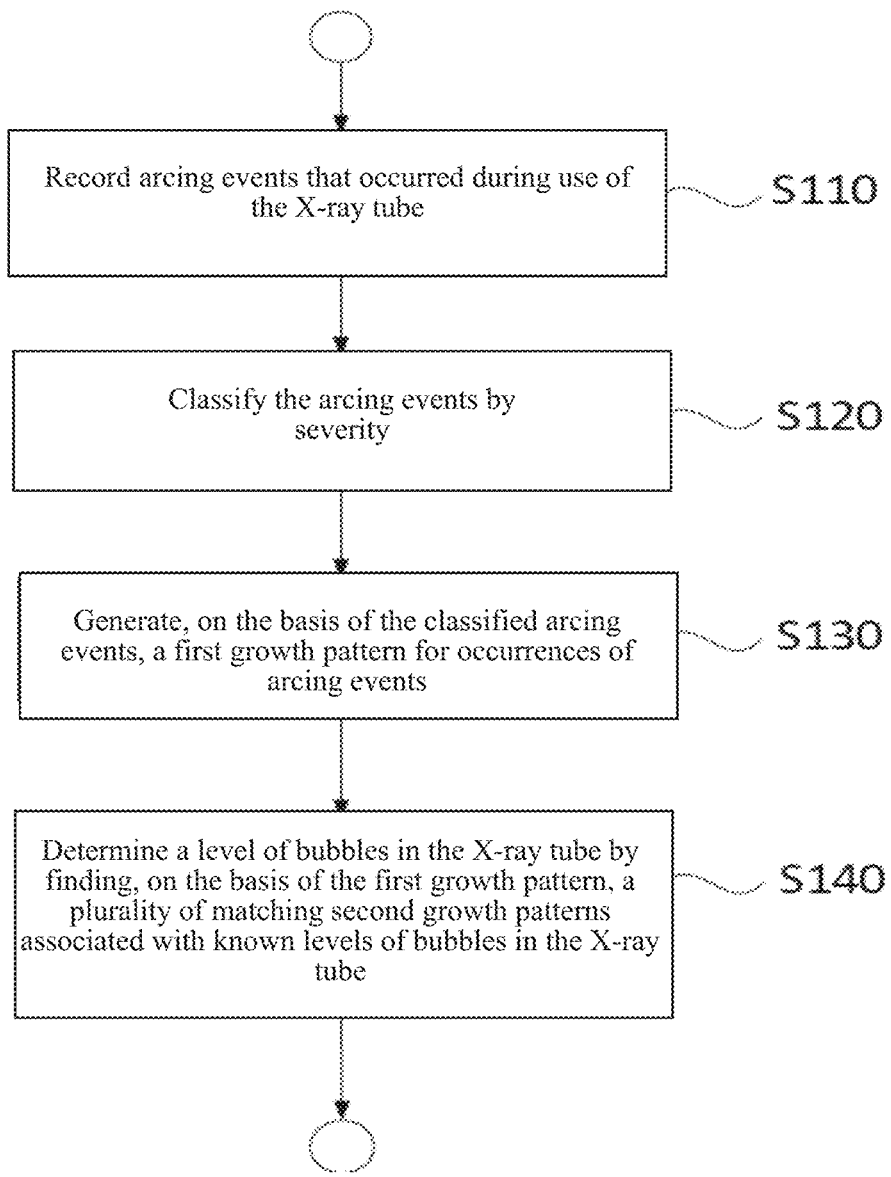
FIG. 1 is a flowchart of a method for evaluating the performance of an X-ray tube according to an aspect of the present disclosure.

The reference signs used in the drawings are as follows:

200a: Class I first curve

200b: Class II first curve
200c: Class III first curve
300: Apparatus for evaluating the performance of an X-ray tube
302: Sensing part
304: Processing part
306: Computing part

DETAILED DESCRIPTION

In order to provide a better understanding of the technical features, objectives, and beneficial effects of the present disclosure, specific aspects of the present disclosure will be described below with reference to the drawings, in which the same reference signs denote the same parts.

"Schematic" mentioned herein means "serving as an example, instance, or explanation", and any illustration or aspect described as "schematic" herein should not be construed as a more preferred or advantageous technical solution.

For the sake of brevity of the drawings, each drawing only schematically shows parts related to the present disclosure, and they do not represent the actual structure of the product. In addition, in order to make the drawings concise and easy to understand, in some drawings, only one of the components that have the same structure or function is schematically shown, or only one of them is marked.

"One" mentioned herein not only means "only this one", but can also indicate a situation where there are "more than one". Herein, terms "first", "second", etc. are only intended to distinguish between each other, rather than indicating a sequence or degree of importance, or dependence of existence on each other.

An insulating oil for cooling during the use of an X-ray tube, as the length of use time increases, generates bubbles, which accumulate. A source of bubbles is that, for example, after a high-energy X-ray bombards the insulating oil, the insulating oil is cracked and gas is generated; in addition, outside air is diffused into the insulating oil through a circulation line for pumping an insulating oil, and thus bubbles form and accumulate.

Arcing is also known as discharging or arc striking, and when arcing occurs in an X-ray tube, the resistance between the tube voltages of the X-ray tube is reduced, and the voltage will drop rapidly. By detecting the degree of a voltage drop, it is possible to judge whether arcing has occurred, and the severity of arcing may be determined according to the rate and amplitude of voltage drop.

A high voltage is usually applied across the cathode and anode of an X-ray tube, which is the tube voltage of the X-ray tube, to accelerate the electrons in the vacuum of the X-ray tube, thereby bombarding the anode disk to generate X-rays. However, when the insulativity of the insulating oil is reduced due to the accumulation of bubbles, an electric field generated at a high voltage will suffer an electric field breakdown effect because the bubbles have reduced the insulativity of the insulating oil, which results in an arcing or arc striking event. Accordingly, there is a correlation between the occurrence of arcing events and the level of bubbles in an X-ray tube, and the level of bubbles in an X-ray tube may be used as an index for evaluating the performance of the X-ray tube.

No function or apparatus for discharging gas is provided in an existing X-ray tube system. When an X-ray tube contains an insulating oil contaminated to a certain extent by bubbles, arcing occurs when the X-ray tube operates, which damages the original potential field and even renders the X-ray tube unable to generate any X-rays. In order to identify any faults in the X-ray tube caused by bubbles, a professional operator often needs to arrive at the site, disassemble the X-ray tube or the cooling apparatus (a circulatory pumping apparatus usually based on an insulating oil), return it to the factory, mount it on a special test facility, and, by rotating and vibrating the cooling apparatus through different angles, for example, and listening to sounds produced by the cooling apparatus, check whether there are bubbles in it. In addition, if an X-ray tube is returned to the factory for examination and repair, there is a risk of delayed detection of performance impairment of the X-ray tube.

Therefore, the present disclosure provides a method for evaluating the performance of an X-ray tube, which allows levels of bubbles in the X-ray tube to be determined in a timely manner on the basis of arcing events or logs recorded remotely or online during the use of the X-ray tube.

FIG. 1 is a flowchart of a method for evaluating the performance of an X-ray tube according to an aspect of the present disclosure.

In step S110, arcing events that occurred during the use of the X-ray tube are recorded.

Herein, occurrence of an arcing event is determined by, for example, detecting, with a sensing circuit, a rapid drop in voltage across the cathode and anode of the X-ray tube.

Herein, a scanning operation state of the X-ray tube may be judged by acquiring an error log related to the use of the X-ray tube. For example, an error log of a CT system may be used to determine whether the X-ray tube has completed a scan, and to record information about any scan interruptions caused by arcing in the X-ray tube, wherein the occurrence of such a scan interruption is usually accompanied by occurrences of multiple arcing events within a short period of time, and thus arcing events associated with information on this scan interruption may be judged to be serious.

In step S120, arcing events are classified by severity.

According to an exemplary aspect shown, the severities of arcing events are determined by sensing amplitude changes in the tube voltage of the X-ray tube during use, and the severities of the arcing events are classified according to a set interval range of the amplitude change. The tube voltage of the X-ray tube changes in amplitude due to the occurrence of an arcing event, the amplitude change being of a magnitude proportional to the severity of the arcing event, and, accordingly, a plurality of interval ranges is set according to the amplitude change to classify arcing events by interval range, thereby classifying arcing events by severity.

According to another exemplary aspect shown, the severities of arcing events are determined by judging the rate of changes in the tube voltage of the X-ray tube during use, and the severities of the arcing events are classified according to a set interval range of rate of changes. When the tube voltage of the X-ray tube suffers a voltage drop due to the occurrence of an arcing event, the rate of change or rate of the voltage drop is usually proportional to the severity of the arcing event, and a plurality of interval ranges are accordingly set according to the rate of (voltage drop) changes in the tube voltage of the X-ray tube to classify arcing events by interval range, so that arcing events are classified by severity. It should be noted that, for the judgment of the severities of arcing events that occurred during use of the X-ray tube, a plurality of interval ranges may be set by means of the amplitude change and rate of change in the tube voltage of the X-ray tube at the same time, so as to classify, by severity, arcing events that occurred.

In step S130, a first growth pattern for occurrences of arcing events is generated on the basis of classified arcing events.

Herein, the first growth pattern comprises generating a plurality of first curves on the basis of classified arcing events.

Figure 3:
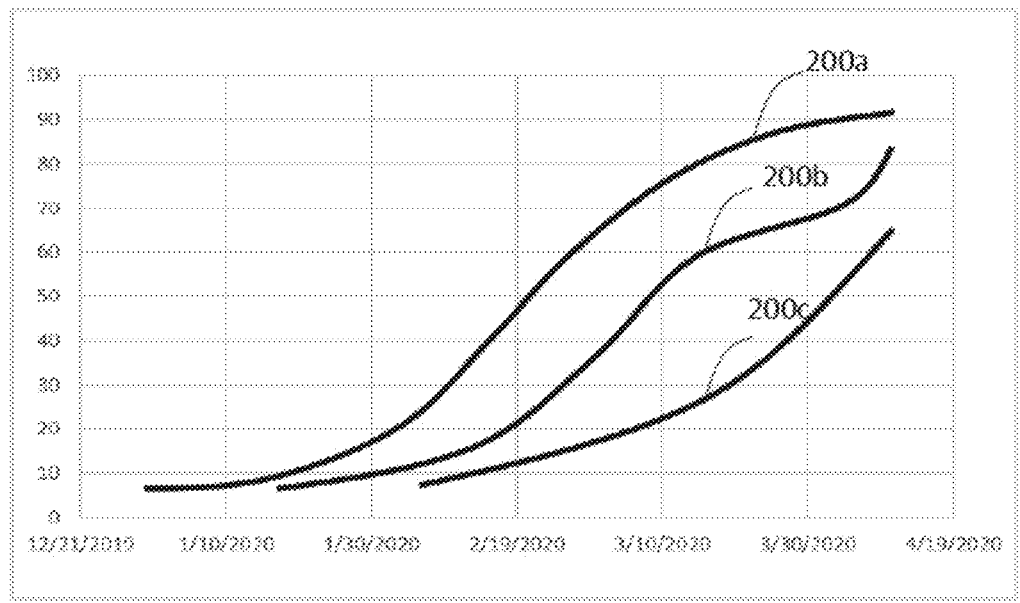
FIG. 3 is a schematic diagram of curves generated after arcing events are classified by severity according to an aspect of the present disclosure.

FIG. 3 is a schematic diagram of curves generated after arcing events are classified by severity according to an aspect of the present disclosure.

As shown in FIG. 3, the first growth pattern comprises Class I arcing events, Class II arcing events, and Class III arcing events classified by severity, and three first curves are generated according to the time and number of occurrences, namely, the Class I first curve 200*a*, the Class II first curve 200*b*, and the Class III first curve 200*c*, wherein the Class III first curve 200*c* represents the curve for the most severe arcing events recorded.

In step S140, a level of bubbles in the X-ray tube is determined by finding, on the basis of the first growth pattern, a plurality of matching second growth patterns associated with known levels of bubbles in the X-ray tube.

Herein, since the first growth pattern comprises generating a plurality of first curves on the basis of classified arcing events, the corresponding second growth pattern comprises a corresponding number of second curves, and involves the same criteria for classifying arcing events by severity as in the first growth pattern. In the second growth pattern, determined correspondences between various known or a priori levels of bubbles in X-ray tube and arcing events are recorded. By matching the recorded first growth pattern related to arcing events and a plurality of a priori second growth patterns, it is possible to predict the current situation and trends of changes in the level of bubbles in the X-ray tube.

According to an exemplary aspect shown, by comparing similarities between the first growth pattern and the second growth pattern, it is possible to predict or judge levels of bubbles in the X-ray tube or trends of changes therein. For example, similarities or degrees of similarities borne by the Class I first curve 200*a*, the Class II first curve 200*b*, and the Class III first curve 200*c* to the corresponding second curves in the plurality of second growth patterns are compared respectively, so as to find a matching second growth pattern, thereby predicting or judging the current level of bubbles in the X-ray tube or trends of changes therein.

According to another exemplary aspect shown, it is possible to predict or judge the level of bubbles in the X-ray tube or trends of changes therein by comparing the growth rate of the first growth pattern with that of the second growth pattern. Similarities borne by the Class I first curve 200*a*, the Class II first curve 200*b*, and the Class III first curve 200*c* to the corresponding second curve growth rates in the plurality of second growth patterns are compared to find a matching second growth pattern, thereby predicting or judging the current level of bubbles in the X-ray tube or trends of changes therein.

It should be noted that when the first growth pattern and the second growth pattern are compared to find one or more matching second growth patterns, similarities between and/or growth rates of various combinations in the first curves and the corresponding second curves may be compared to find a match. No limit is imposed on this in the present aspect.

Figure 2:
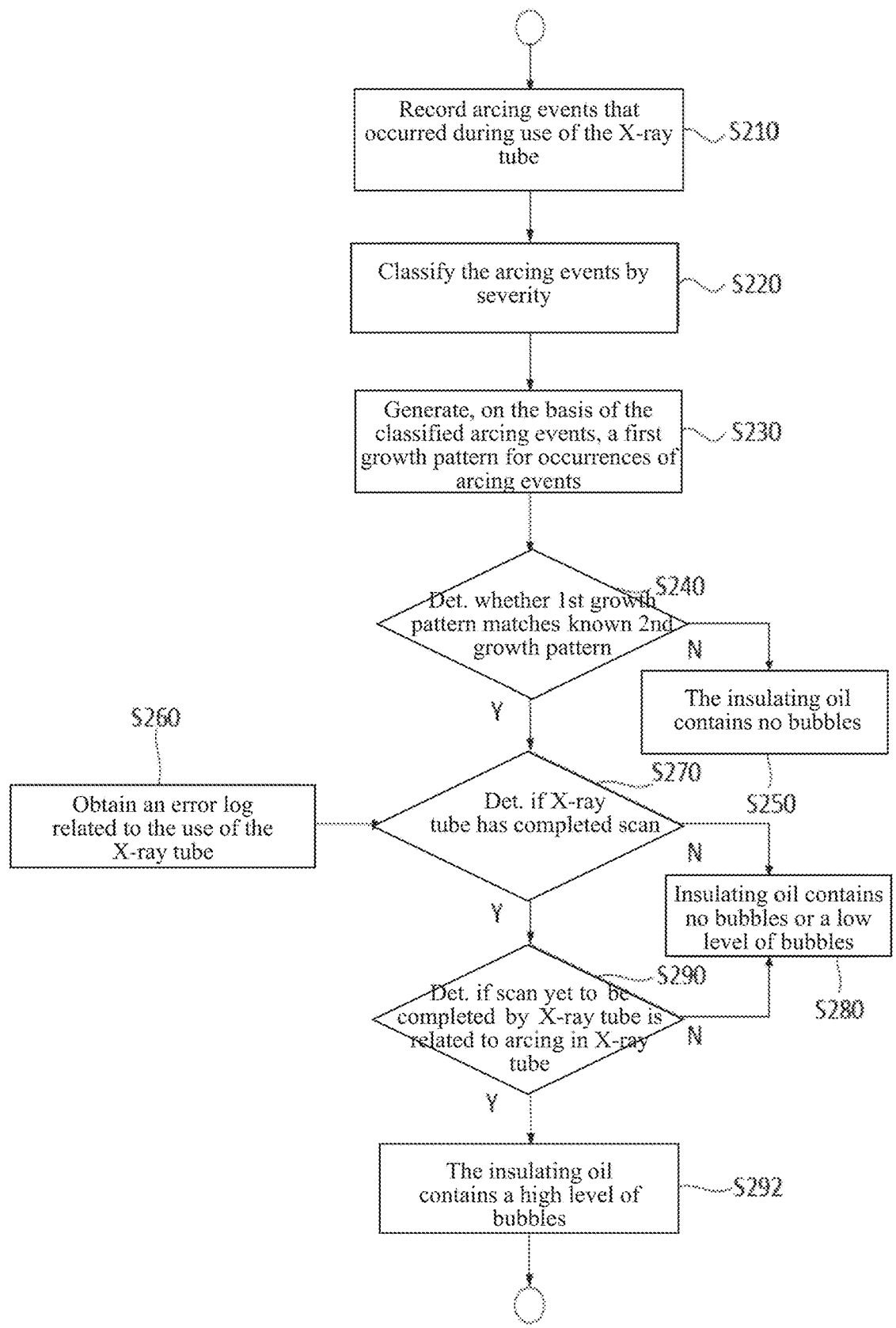
FIG. 2 is a flowchart of a method for evaluating the performance of an X-ray tube according to another aspect of the present disclosure.

FIG. 2 is a flowchart of a method for evaluating the performance of an X-ray tube according to another aspect of the present disclosure.

As shown in FIG. 2, in the method for evaluating the performance of an X-ray tube in this aspect, steps S210 to S230 are the same as the above-described steps S110 to S130, and thus will not be described in detail again herein. The method for evaluating the performance of an X-ray tube in this aspect further comprises the following steps:

In step S240, whether the first growth pattern matches a known second growth pattern is determined.

In step S250, if no match is found, then it is judged that the insulating oil contains no bubbles.

In step S260, an error log related to the use of the X-ray tube is acquired.

In step S270, whether the X-ray tube has completed a scan is determined.

In step S280, if the scan has not been completed, then it is judged that the insulating oil contains no bubbles or a low level of bubbles.

In step S290, whether the scan yet to be completed by the X-ray tube is related to an arcing event of the X-ray tube is determined. If not, then it is judged that the insulating oil contains no bubbles or a low level of bubbles.

In step S292, if it is judged that the scan yet to be completed by the X-ray tube is related to an arcing event of the X-ray tube, then it is judged that the level of bubbles in the insulating oil is relatively high.

Figure 4:
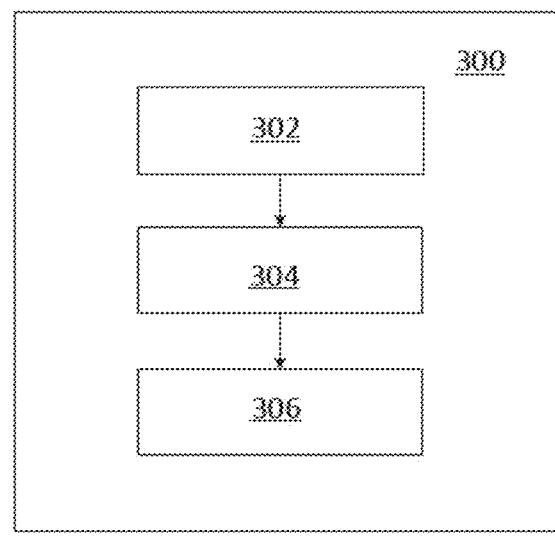
FIG. 4 is a structural block diagram of an apparatus for evaluating the performance of an X-ray tube according to an aspect of the present disclosure.

FIG. 4 is a structural block diagram of an apparatus for evaluating the performance of an X-ray tube according to an aspect of the present disclosure.

As shown in FIG. 4, the apparatus 300 for evaluating the performance of an X-ray tube comprises: a sensing part 302, configured to record arcing events that occurred during the use of the X-ray tube; a processing part 304, configured to classify the arcing events by severity and generate, on the basis of the classified arcing events, a first growth pattern for occurrences of arcing events; and a computing part 306, configured to determine a level of bubbles in the X-ray tube by finding, on the basis of the first growth pattern, a matching second growth pattern associated with a known level of bubbles in the X-ray tube.

The sensing part 302 may comprise a sensing circuit configured to sense voltage drops in the tube voltage of the X-ray tube to record arcing events that occurred during the use of the X-ray tube. In addition, the sensing part 302 may further comprise a memory or a medium to record the above-mentioned arcing events.

According to the apparatus 300 for evaluating the performance of an X-ray tube according to some aspects shown, the processing part 304 is configured to obtain an error log related to the use of the X-ray tube, and determine a scanning operation state of the X-ray tube. Herein, an error log is, for example, information recorded by a CT system or X-ray test facility about scan interruptions caused by arcing in the X-ray tube.

With the apparatus 300 for evaluating the performance of an X-ray tube according to some aspects shown, the processing part 304 is configured to determine the severities of arcing events by judging the rate of changes in the tube voltage of the X-ray tube during use, and classify the arcing events by severity according to a set interval range of rate of changes.

With the apparatus 300 for evaluating the performance of an X-ray tube according to some aspects shown, the processing part 304 is configured to determine the severities of arcing events by judging the rate of changes in the tube voltage of the X-ray tube during use, and classify the arcing events by severity according to a set interval range of rate of changes.

With the apparatus 300 for evaluating the performance of an X-ray tube according to some aspects shown, the computing part 306 is further configured to compare similarities between the first growth pattern and the second growth pattern.

With the apparatus 300 for evaluating the performance of an X-ray tube according to some aspects shown, the computing part 306 is further configured to compare the growth rate of the first growth pattern and that of the second growth pattern.

According to some aspects shown, the first growth pattern comprises generating a plurality of first curves on the basis of classified arcing events, and the second growth pattern comprises at least a corresponding number of second curves. When the computing part 306 compares similarities between growth rates of the first growth pattern and the second growth pattern, similarities between growth rates of one or a combination of the first curves and the corresponding second curves may be compared respectively, so as to match the first growth pattern with a second growth pattern to predict or evaluate the level of bubbles in the X-ray tube, thereby helping to evaluate the performance of the X-ray tube.

It should be noted that the processing part 304 and the computing part 306 may be various general-purpose and/or special-purpose processing components with processing and computing capabilities.

According to another aspect of the present disclosure, an electronic device is provided, comprising: at least one processor; and a memory communicatively connected to the at least one processor; the memory stores a computer program that, when executed by the at least one processor, implements the method according to the above-described aspects. In some aspects, the electronic device may comprise a computed tomographic scanner system.

According to another aspect of an aspect of the present disclosure, a non-transitory computer-readable storage medium storing a computer program is provided, wherein the computer program, when executed by a processor, implements the above-described method.

According to another aspect of an aspect of the present disclosure, a computer program product is provided, comprising a computer program, wherein the computer program, when executed by a processor, implements the above-described method.

Figure 5:
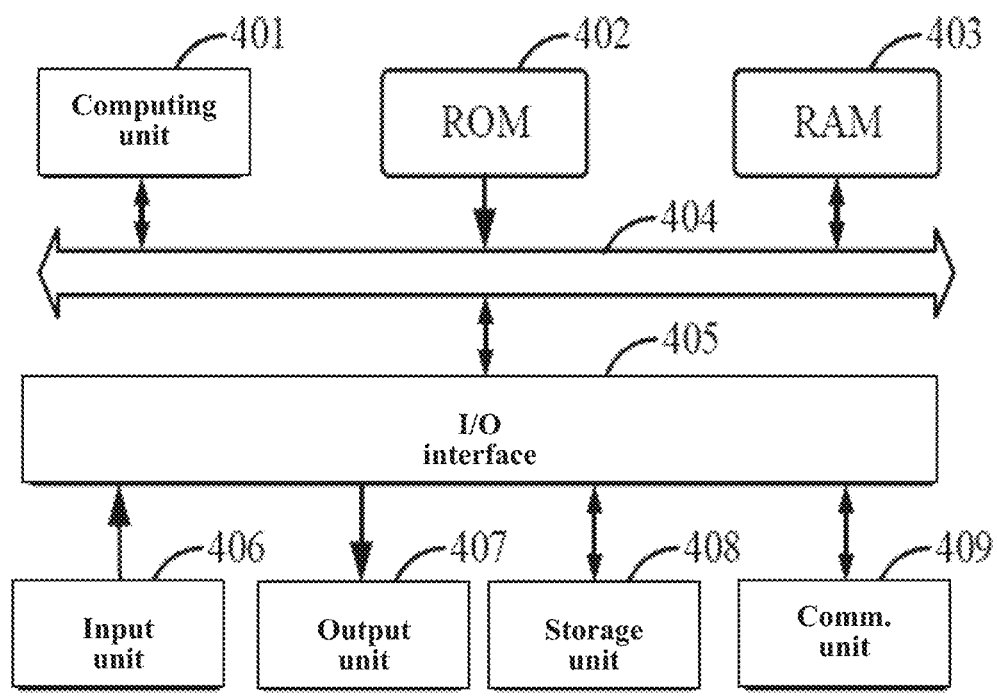
FIG. 5 is a structural block diagram of an exemplary electronic device that may be used to implement aspects of the present disclosure.

Referring to FIG. 5, a structural block diagram of an electronic device 400, which may be used as the present disclosure, will be described below, as an example of a hardware device applicable to various aspects of the present disclosure. Electronic devices are intended to indicate various forms of digital electronic computer devices, such as laptop computers, desktop computers, workstations, personal digital assistants, servers, blade servers, mainframe computers, and other suitable computers. Electronic devices may also indicate various forms of mobile devices, such as personal digital assistants, cellular phones, smartphones, wearable devices, and other similar computing devices. The components shown herein, connections and relationships among them, and their functions are provided for illustrative purposes only, rather than being intended to limit implementations of the disclosure described and/or claimed herein.

As shown in FIG. 5, the device 400 comprises a computing unit 401, capable of performing various appropriate actions and handling according to a computer program stored in a read-only memory (ROM) 402 or loaded from a storage unit 408 into a random-access memory (RAM) 403. In the RAM 403, various programs and data required for the operation of the device 400 may also be stored. The computing unit 401, the ROM 402, and the RAM 403 are connected to one another through a bus 404. An input/output (I/O) interface 405 is also connected to the bus 404.

Various components in the device 400 are connected to the I/O interface 405, including an input unit 406, an output unit 407, a storage unit 408, and a communication unit 409. The input unit 406 may be any type of device capable of inputting information to the device 400, wherein the input unit 406 may receive inputted numerical or character information, generate key signal input related to user settings and/or function control of an electronic device, and may include, but is not limited to, a mouse, a keyboard, a touch screen, a trackpad, a trackball, a joystick, a microphone and/or a remote control. The output unit 407 may be any type of device capable of presenting information, and may include, but is not limited to, a display, a speaker, video/audio output terminals, a vibrator, and/or a printer. The storage unit 408 may include, but is not limited to, a magnetic disk and an optical disk. The communication unit 409 allows the device 400 to exchange information/data with other devices over computer networks such as the Internet and/or various telecommunication networks, and may include, but is not limited to, a modem, a network interface card, an infrared communication device, and a wireless communication transceiver and/or chipset, for example, a Bluetooth™ device, a 1302.11 device, a Wi-Fi device, a WiMax device, a cellular communication device and/or the like.

The computing unit 401 may be one of various general-purpose and/or special-purpose processing components with processing and computing capabilities. Some examples of the computing unit 401 include, but are not limited to, central processing units (CPUs), graphics processing units (GPUs), various specialized artificial intelligence (AI) computing chips, various computing units that run machine learning model algorithms, digital signal processors (DSPs), and any suitable processor, controller, microcontroller, etc. The computing unit 401 performs the various methods and processes described above, such as a method for evaluating the performance of an X-ray tube according to an aspect of the present disclosure. For example, in some aspects, a method according to an aspect of the present disclosure may be implemented as a computer software program tangibly incorporated on a machine-readable medium, for example, the storage unit 408. In some aspects, part or all of a computer program may be loaded and/or installed on the device 400 via the ROM 402 and/or the communication unit 409. When a computer program is loaded into the RAM 403 and executed by the computing unit 401, one or more steps of the method described above may be performed. Alternatively, in other aspects, the computing unit 401 may be configured by any other suitable means (for example, by means of firmware) to perform a method according to an aspect of the present disclosure.

Various implementations of the systems and techniques described herein above may be achieved in digital electronic circuitry, integrated circuit systems, Field Programmable Gate Arrays (FPGAs), application-specific integrated circuits (ASICs), application-specific standard products (ASSPs), systems on chips (SoCs), Complex Programmable Logic Devices (CPLDs), computer hardware, firmware, software, and/or a combination thereof. These various implementations may include implementation in one or more computer programs executable and/or interpretable on a programmable system comprising at least one programmable processor, wherein the programmable processor may be a special-purpose or general-purpose programmable processor that can receive data and instructions from a storage system, at least one input device, and at least one output device, and transmit data and instructions to the storage system, said at least one input device, and said at least one output device.

Program codes used to implement a method of the present disclosure may be written in any combination of one or more programming languages. These program codes may be provided to a processor or controller of a general-purpose computer, a dedicated computer, or any other programmable data processing device, so that the program codes, when executed by the processor or controller, cause the functions/operations as specified in a flowchart and/or block diagram to be performed. A program code may be executed fully in a machine, executed partially in a machine, executed partially in a machine as a standalone software package and executed partially in a remote machine or executed fully in a remote machine or server.

In the context of the present disclosure, a machine-readable medium may be a tangible medium that may contain or store a program to be used by an instruction execution system, apparatus, or device, or used in combination with an instruction execution system, apparatus, or device. A machine-readable medium may be a machine-readable signal medium or a machine-readable storage medium. Machine-readable mediums may include, but are not limited to, electronic, magnetic, optical, electromagnetic, infrared, or semiconductor systems, or any appropriate combination thereof. More specific examples of machine-readable mediums may include an electrical connection based on one or more wires, a portable computer disk, a hard disk, a random-access memory (RAM), a read-only memory (ROM), an erasable programmable read-only memory (EPROM or flash memory), an optical fiber, a compact disk read-only memory (CD-ROM), an optical storage device, and a magnetic storage device, or any appropriate combination thereof.

In order to allow interaction with a user, the systems and techniques described herein may be implemented on a computer having: a display device, for example, a cathode-ray tube (CRT) or liquid crystal display (LCD) monitor, for displaying information to a user; and a keyboard and a pointing device (for example, a mouse or trackball) with which a user can provide input to the computer. Other kinds of devices may also be used to allow interaction with a user; for example, feedback provided to a user may be any form of sensory feedback (for example, visual feedback, auditory feedback, or tactile feedback); input from a user may be received in any form (including acoustic input, voice input, and tactile input).

The systems and techniques described herein may be implemented in a computing system comprising back-end components (functioning as a data server, for example), or a computing system comprising middleware components (for example, an application server), or a computing system comprising front-end components (for example, a user computer having a graphical user interface or web browser through which a user may interact with implementations of the systems and techniques described herein), or a computing system comprising any combination of such backend components, middleware components, or front-end components. The components of a system may be interconnected by digital data communication in any form or on any medium (for example, a communication network). Examples of communication networks include local area networks (LANs), wide area networks (WANs), and the Internet.

A computer system can comprise a client and a server. A client and a server are generally far away from each other and usually interact with each other through a communication network. A relationship is established between a client and a server by computer programs running on corresponding computers and having a client-server relationship with each other.

It should be understood that steps may be reordered, added or deleted using the various forms of flows shown above. For example, the steps described in the present disclosure may be performed concurrently, sequentially, or in different orders, which is not limited herein, as long as results expected from the technical solutions disclosed in the present disclosure are achievable.

While aspects or examples of the present disclosure have been described above with reference to the drawings, it should be understood that the above-described methods, systems and devices are merely illustrative aspects or examples, and that the scope of the present invention, rather than being limited by these aspects or examples, is defined only by the authorized claims and equivalents thereof. Various elements in the aspects or examples may be omitted or replaced by equivalents thereof. In addition, steps may be performed in a sequence different from one described in the present disclosure. Furthermore, various elements in the aspects or examples may be combined in various manners. Importantly, as technology develops, many of the elements described herein may be replaced by equivalent elements that will become known after the present disclosure.

What have been described above are only aspects of the present invention, rather than being intended to limit the scope of the present invention, and any modifications, equivalent substitutions, and improvements made without departing from the spirit or principle of the present invention shall fall within the protection scope of the present invention.

The invention claimed is:

1. A method for evaluating a performance of an X-ray tube, the method comprising:
   recording arcing events that occurred during use of the X-ray tube;
   classifying the arcing events by severity;
   generating, on the basis of the classified arcing events, a first growth pattern for occurrences of arcing events; and
   determining a level of bubbles in the X-ray tube by finding, on the basis of the first growth pattern, a plurality of matching second growth patterns associated with known levels of bubbles in the X-ray tube.

2. The method as claimed in claim 1, wherein said classifying the arcing events by severity comprises:
   obtaining an error log related to the use of the X-ray tube; and
   judging a scanning operation state of the X-ray tube.

3. The method as claimed in claim 1, wherein said determining, on the basis of the first growth pattern, a plurality of matching second growth patterns associated with the known level of bubbles in the X-ray tube comprises:
   comparing similarities between the first growth pattern and the plurality of matching second growth patterns.

4. The method as claimed in claim 1, wherein said determining, on the basis of the first growth pattern, a plurality of matching second growth patterns associated with a known level of bubbles in the X-ray tube comprises:

comparing a growth rate of the first growth pattern with that of the second growth pattern.

5. The method as claimed in claim 1, wherein said classifying the arcing events by severity comprises:
determining the severities of the arcing events by judging amplitude changes in a tube voltage of the X-ray tube during use, and classifying the arcing events by severity according to a set interval range of the amplitude changes.

6. The method as claimed in claim 1, wherein said classifying the arcing events by severity comprises:
determining the severities of the arcing events by judging a rate of change in a tube voltage of the X-ray tube during use; and
classifying the arcing events by severity according to a set interval range of the rate of change.

7. The method as claimed in claim 1, wherein the generating the first growth pattern comprises generating a plurality of first curves on the basis of the classified arcing events, and the plurality of matching second growth patterns comprises at least a corresponding number of second curves.

8. An electronic device, comprising:
at least one processor; and
a memory communicatively connected to the at least one processor,
wherein the memory stores a computer program that, when executed by the at least one processor, implements the method as claimed in claim 1.

9. A non-transitory computer-readable storage medium storing a computer program, wherein the computer program, when executed by a processor, implements the method as claimed in claim 1.

10. An apparatus for evaluating a performance of an X-ray tube, comprising:
a sensing part, configured to record arcing events that occurred during use of the X-ray tube;
a processing part, configured to classify the arcing events by severity and generate, on the basis of the classified arcing events, a first growth pattern for occurrences of arcing events; and
a computing part, configured to determine a level of bubbles in the X-ray tube by finding, on the basis of the first growth pattern, a matching second growth pattern associated with a known level of bubbles in the X-ray tube.

11. The apparatus as claimed in claim 10, wherein the processing part is further configured to acquire an error log related to the use of the X-ray tube, and to determine a scanning operation state of the X-ray tube.

12. The apparatus as claimed in claim 10, wherein the computing part is further configured to compare similarities between the first growth pattern and the second growth pattern.

13. The apparatus as claimed in claim 10, wherein the computing part is further configured to compare a growth rate of the first growth pattern with that of the second growth pattern.

14. The apparatus as claimed in claim 10, wherein the processing part is further configured to determine the severities of the arcing events by judging a rate of change in a tube voltage of the X-ray tube during use, and to classify the arcing events by severity according to a set interval range of the rate of change.

15. The apparatus as claimed in claim 10, wherein the generating the first growth pattern comprises generating a plurality of first curves on the basis of the classified arcing events, and the determining the second growth pattern comprises at least a corresponding number of second curves.

* * * * *